(12) United States Patent
Kang (10) Patent No.: US 7,978,494 B2
(45) Date of Patent: Jul. 12, 2011

(54) RADIO FREQUENCY IDENTIFICATION DEVICE INITIALIZING A MEMORY USING AN OFFSET VOLTAGE

(75) Inventor: Hee Bok Kang, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 239 days.

(21) Appl. No.: 12/344,638

(22) Filed: Dec. 29, 2008

(65) Prior Publication Data

US 2009/0303771 A1    Dec. 10, 2009

(30) Foreign Application Priority Data

Jun. 9, 2008    (KR) ................. 10-2008-0053724

(51) Int. Cl.
*G11C 11/22* (2006.01)

(52) U.S. Cl. ..... 365/145; 365/149; 365/205; 365/189.09
(58) Field of Classification Search .................. 365/145, 365/149, 189.09, 192; 340/10.34, 572.1
See application file for complete search history.

(56) References Cited

U.S. PATENT DOCUMENTS

| 6,493,251 | B2* | 12/2002 | Hoya et al. | 365/145 |
| 6,809,952 | B2* | 10/2004 | Masui | 365/145 |
| 6,847,568 | B2 | 1/2005 | Gogl et al. | |
| 7,486,172 | B2* | 2/2009 | Martinez et al. | 340/10.2 |
| 2006/0268631 | A1 | 11/2006 | Kang et al. | |

* cited by examiner

*Primary Examiner* — David Lam
(74) *Attorney, Agent, or Firm* — Ladas & Parry LLP (57) ABSTRACT

An RFID device sets initial data stored in a memory using an offset voltage and includes an analog block, a digital block, and a memory block. The memory blocks is configured to read/write data in a cell array unit. The memory block includes an offset controller that is configured to set an offset voltage value of a bit line connected to the cell array unit.

25 Claims, 12 Drawing Sheets

RADIO FREQUENCY IDENTIFICATION DEVICE INITIALIZING A MEMORY USING AN OFFSET VOLTAGE

CROSS-REFERENCE TO RELATED APPLICATION

This application claims the benefit of priority to Korean Patent Application No. 10-2008-0053724, filed on Jun. 9, 2008, the entire contents of which are incorporated herein by reference.

BACKGROUND OF THE INVENTION

The present invention relates generally to a radio frequency identification (RFID) device, and more particularly to initializing a memory of an RFID device using an offset voltage.

An RFID device has numerous applications. For example, an RFID device may be utilized in a physical distribution managing system, a user identification system, an electronic money system, and a traffic system.

The physical distribution managing system performs cargo distribution and inventory control using an integrated circuit (IC) tag where data are recorded instead of utilizing a delivery slip. The user identification system manages exit and entry control using an IC card on which personal information is recorded.

A nonvolatile memory, for example a ferroelectric memory, may be used as a memory used in an RFID tag.

Generally, the data processing speed of a Ferroelectric Random Access Memory (FeRAM) is similar to that of Dynamic Random Access Memory (DRAM). Also, the FeRAM is a non-volatile memory device, and therefore, the data stored in the FeRAM is conserved even after power is turned off.

An FeRAM device, having a structure similar to that of a DRAM device, includes capacitors made of a ferroelectric substance. Further, the FeRAM device has a high residual polarization allowing for data retention even when an electric field is removed.

Figure 1:
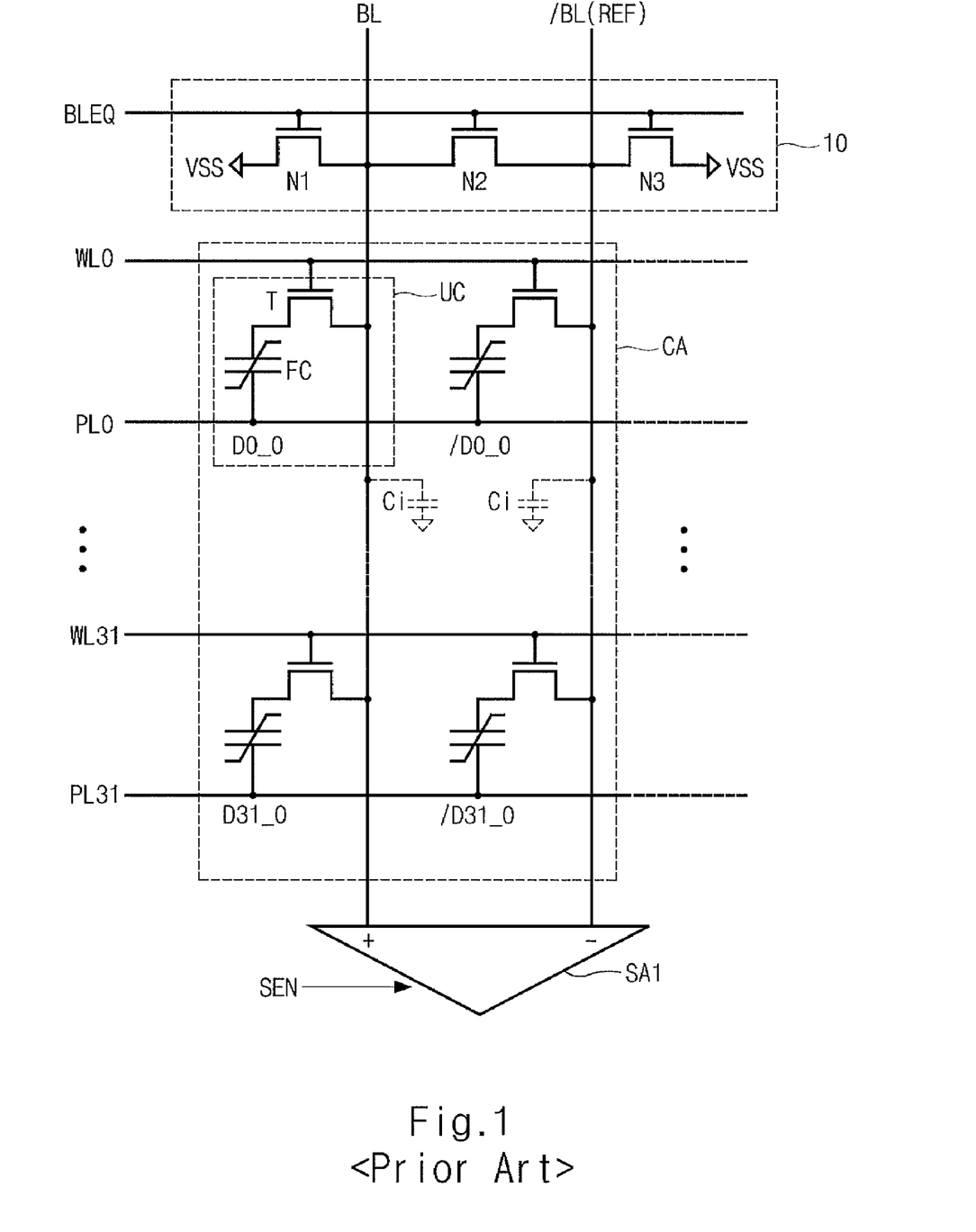
FIG. 1 is a circuit diagram showing a cell array unit of a conventional RFID device.

FIG. 1 is a circuit diagram showing a cell array unit of a conventional RFID device. The cell array unit shown in FIG. 1 comprises a cell array CA, a sense amplifier SA1, and a bit line equalizer 10.

The cell array CA includes a pair of bit lines BL, /BL, a plurality of word lines WL, a plurality of plate lines PL, and a plurality of unit cells UC positioned at intersections of the word lines WL and the bit lines BL, /BL between a word line WL and a plate line PL.

A unit cell UC connected to the bit line BL and a unit cell connected to the bit line /BL store conjugate data D, /D, respectively. A voltage sensed in the cell array is applied to the bit line BL, and a reference voltage REF is applied to the bit line /BL.

Each of the unit cells UC includes a switching element T and a ferroelectric capacitor FC. The ferroelectric capacitor FC is connected between the plate line PL and the switching element T. The switching element T is connected between the bit line BL (or the bit line /BL) and the ferroelectric capacitor FC. The switching element T may comprise, for example, a MOS transistor. A gate of the MOS transistor (switching element T) is connected to the word line WL.

The sense amplifier SA1 is connected between the paired bit lines BL and /BL, and activated by a sense amplifier enable signal SEN. When the sense amplifier SA1 is activated by the sense amplifier enable signal SEN, the sense amplifier SA1 senses and amplifies a voltage difference of the paired bit lines BL and /BL.

The bit line equalizer 10 includes NMOS transistors N1~N3. The NMOS transistor N1 is connected between a ground voltage terminal VSS and the bit line BL, the NMOS transistor N2 is connected between the paired bit lines BL and /BL, and the NMOS transistor N3 is connected between the ground voltage terminal VSS and the bit line /BL. As shown in FIG. 1, the respective gates of the NMOS transistors N1~N3 are connected to a bit line equalizing signal BLEQ. When the bit line equalizing signal BLEQ is activated, the NMOS transistors N1~N3 are turned on thereby equalizing the paired bit lines BL and /BL.

In the cell array CA, the capacitance CBL of the bit line BL has a capacitance Ci.

Figure 2:
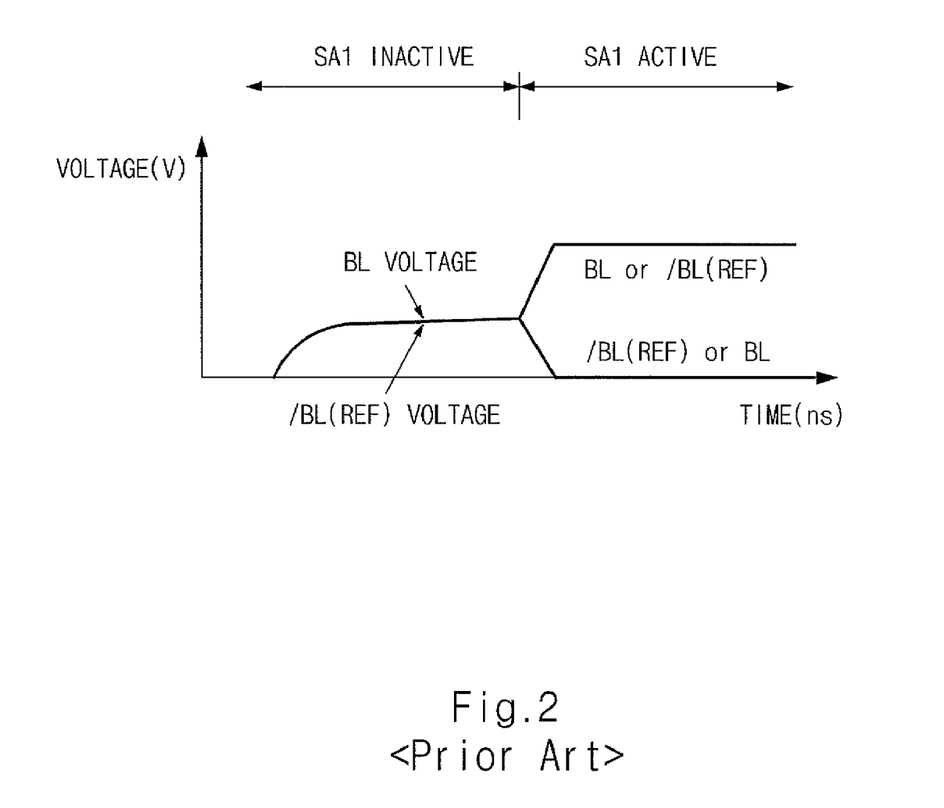
FIG. 2 is a graph showing a voltage waveform of a bit line in a cell operation of the cell array unit of FIG. 1.

FIG. 2 is a graph showing a voltage waveform of the bit line in the cell operation of the cell array unit of FIG. 1.

The bit line equalizer 10 is activated, before activating the sense amplifier SA1, to equalize voltage levels of the bit line BL and the bit line /BL (REF). After the sense amplifier SA1 is activated, the bit line equalizer 10 is inactivated, and the voltage levels of the bit lines BL and /BL are different from each other.

In the initial cell operation, the capacitance Ci of the bit lines BL and /BL is the same. Also, since the amount of charges stored in each cell is the same, the sensing voltage applied to the bit line BL and /BL is the same.

Figure 3:
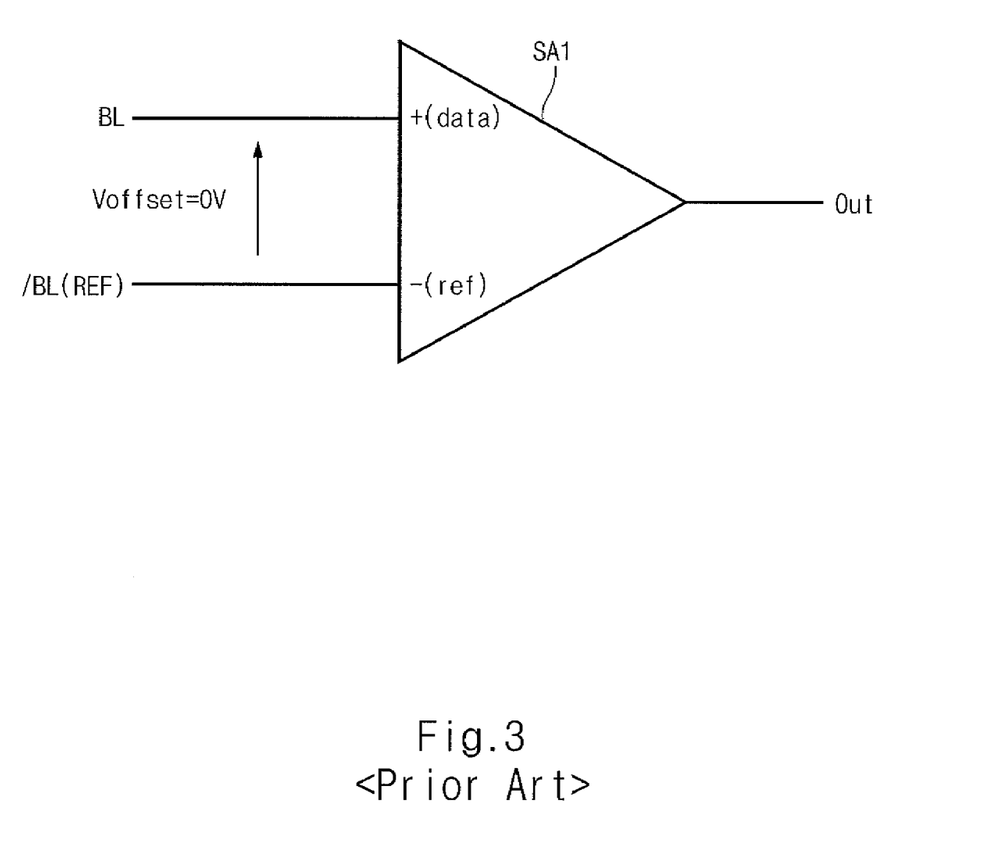
FIG. 3 is a diagram shown for illustrating an offset voltage of a sense amplifier of FIG. 1.

FIG. 3 is a diagram showing an offset voltage of the sense amplifier of FIG. 1.

In the conventional cell array unit, the voltage levels of the bit line BL and the bit line /BL (REF) are the same before the sense amplifier SA1 is activated. That is, the voltage level of the bit line BL inputted to a positive (+) terminal of the sense amplifier SA1 is the same as the reference voltage level of the bit line /BL inputted to a negative (−) terminal of the sense amplifier SA1.

When the voltage level of the bit line BL and the bit line /BL are the same, an offset voltage Voffset between the positive (+) terminal and the negative (−) terminal of the sense amplifier SA1 is "0V." That is, there is no offset voltage Voffset between the bit line BL and the bit line /BL.

It is necessary to set initial data stored in the memory of the RFID device as "0" because the memory of the RFID device is designed on the supposition that the initial data stored in the unit cells are all "0."

However, since the offset voltage is not generated in the sense amplifier of the conventional cell array unit, data "0" and "1" are stored together in the unit cells. As a result, a fail occurs when the memory of the RFID device is designed on the supposition that the initial data stored in the unit cells are all "0."

SUMMARY OF THE INVENTION

Various embodiments of the present invention are directed at providing an RFID device.

According to an embodiment of the present invention, an RFID device comprises an analog block, a digital block and a memory block configured to read/write data in a cell array unit. The memory block comprises an offset controller configured to set an offset voltage value of a bit line connected to the cell array unit.

According to another embodiment of the present invention, an RFID device comprises an analog block, a digital block and a memory block configured to read/write data in a cell array unit. The memory block comprises a sense amplifier configured to sense and amplify data of a bit line selected from the cell array unit and to set an offset voltage value of the bit line.

DESCRIPTION OF SPECIFIC EMBODIMENTS

The present invention will be described in detail with reference to the accompanying drawings.

Figure 4:
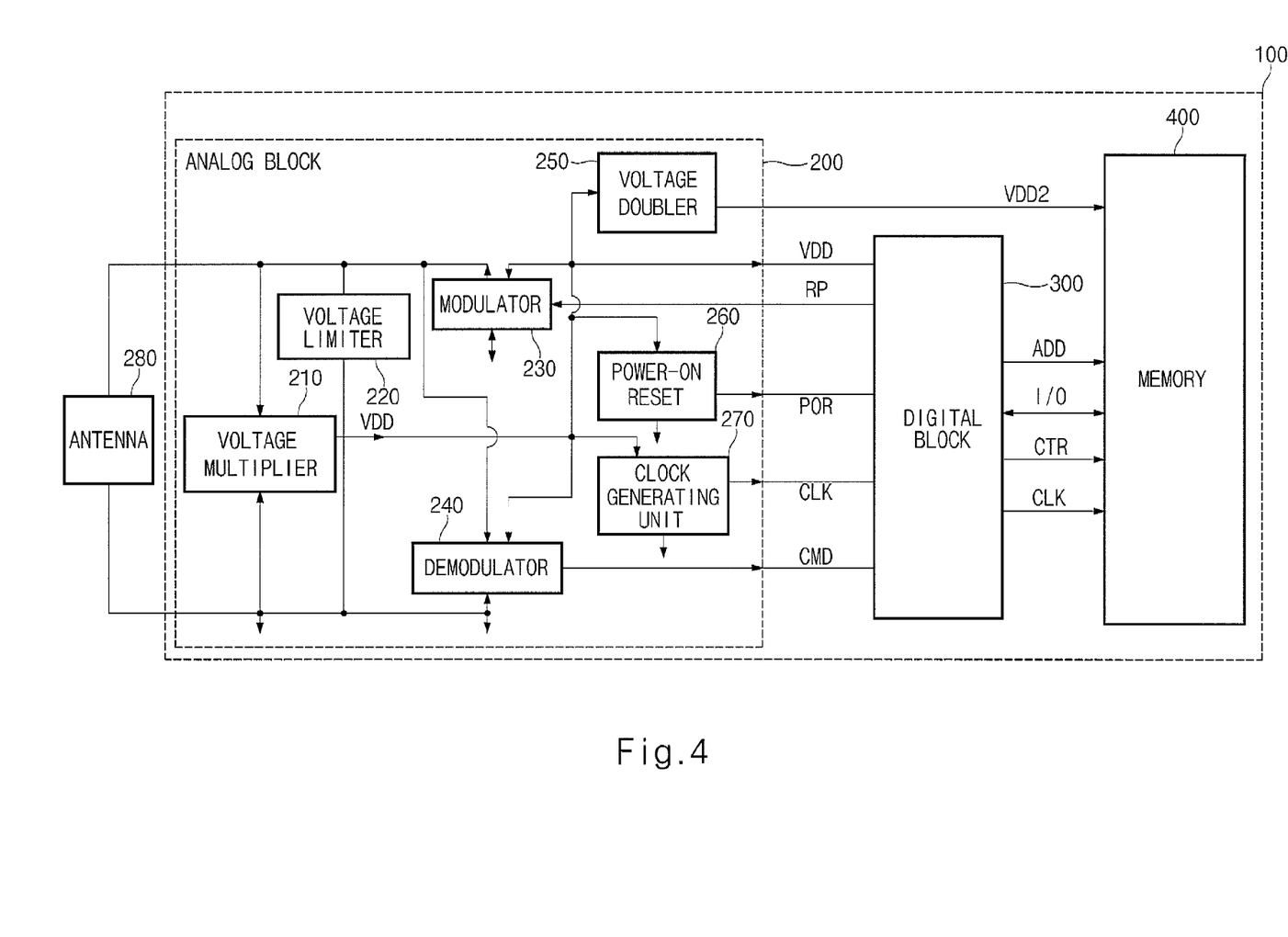
FIG. 4 is a diagram showing an RFID device according to an embodiment of the present invention.

FIG. 4 is a diagram showing an RFID device according to an embodiment of the present invention.

The RFID device of FIG. 4, that is an RFID tag 100, comprises an analog block 200, a digital block 300, and a memory 400. The memory 400 may be, for example, an FeRAM that can control an offset voltage.

The analog block 200 comprises a voltage multiplier 210, a voltage limiter 220, a modulator 230, a demodulator 240, a voltage doubler 250, a power on reset unit 260, a clock generating unit 270, and an antenna 280.

The antenna 280 of the analog block 200 transmits and receives data with an external reader or writer. The voltage multiplier 210 generates a power voltage VDD of the RFID 100 20 corresponding to a transmission frequency received from the antenna 280. The voltage limiter 220 limits the voltage of a radio frequency signal received from the antenna 280, and outputs the radio frequency signal to the demodulator 240.

The modulator 230 modulates a response signal RP received from the digital block 300 to transmit the response signal RP to the antenna 280. The demodulator 240 detects an operation command signal from the radio frequency signal received from the antenna 280 depending on output voltages of the voltage multiplier 210 and the voltage limiter 220, and outputs the detected command signal CMD to a digital block 300.

The voltage doubler 250 boosts the voltage VDD applied from the voltage multiplier 210 by twofold, and supplies a boosting voltage VDD2 to the memory 400. For example, the memory 400 may be an FeRAM that can control an offset voltage.

The power on reset unit 260 senses the voltage VDD, applied from the voltage multiplier 210, and outputs a power on reset signal POR, for controlling a reset operation, to the digital block 300.

The clock generating unit 270 generates a clock CLK for controlling the operation of the digital block 300 depending on the output voltage VDD applied from the voltage multiplier 210 and outputs the clock CLK to the digital block 300.

The digital block 300 receives the power voltage VDD, the power on reset signal POR, the clock CLK, and the command signal CMD from the analog block 200, and generates the response signal RP corresponding to the above received signals, and outputs the response signal RP to the analog block 200.

The digital block 300 outputs an address ADD, input/output data I/O, a control signal CTR, and the clock CLK to the memory 400. The memory 400 may be, for example, a FeRAM that can control an offset voltage.

Figure 5:
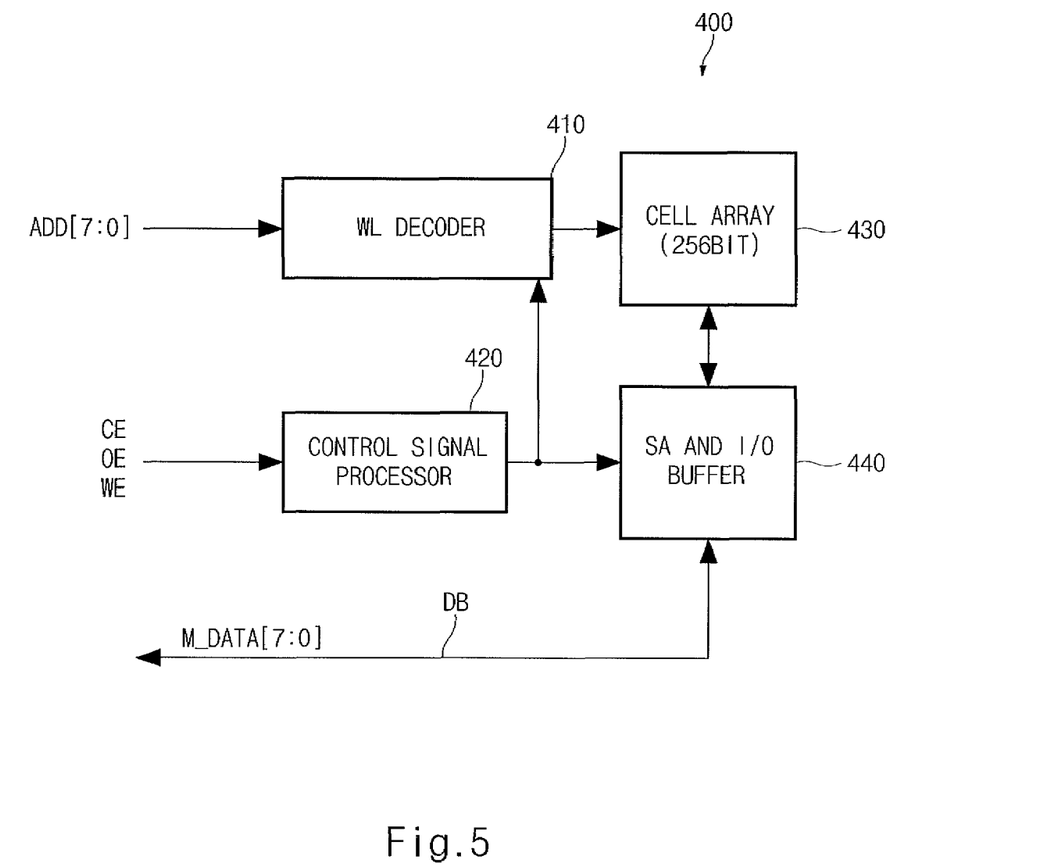
FIG. 5 is a diagram showing a memory of the RFID device of FIG. 4.

FIG. 5 is a diagram showing a memory of the RFID device of FIG. 4. The memory 400 may be, for example, an FeRAM that can control an offset voltage.

The memory 400 comprises a word line decoder 410, a control signal processing unit 420, a cell array unit 430, and a sense amplifier and an input/output buffer 440.

For example, to illustrate the operation of the memory 400, when an address ADD[7:0] is inputted in the word line decoder 410 and the word line decoder 410 decodes the address ADD[7:0] to output the address to the cell array unit 430. The address ADD[7:0] represents a signal applied from an interface controller for selecting a specific word line.

The control signal processing unit 420 receives a chip enable signal CE, an output enable signal OE, and a write enable signal WE, and generates a control signal for controlling read/write operations to output the chip enable signal CE, the output enable signal OE, and the write enable signal WE to the word line decoder 410 and the sense amplifier and the input/output buffer 440.

The cell array unit 430 includes a plurality of memory cells, and the word line decoder 410 selects one of the memory cells included in the cell array unit 430 by the decoded address.

When the memory 400 is an FeRAM that can control an offset voltage, the memory 400 may be, for example, an FeRAM of 236 bits that can control the capacitance of the bit line. In the present embodiment the cell array unit 430 includes 32 rows and 8 columns. However, the present invention is not limited herein, but the size of the cell array unit 430 may include more or less rows and more or less columns.

In the present embodiment each of the 8 column lines of the cell array unit 430 is connected to a sense amplifier 440. That is, the column lines of the cell array unit 430 correspond one by one to the sense amplifier 440, such that the 8 column lines are connected to 8 sense amplifiers 440.

The sense amplifier and the input/output buffer 440 sense and amplify data of the selected cell to output the data to a data bus DB. The sense amplifier and the input/output buffer 440 output data M_DATA[7:0], inputted through the data bus DB from the outside (i.e., externally), to the cell array unit 430.

Figure 6:
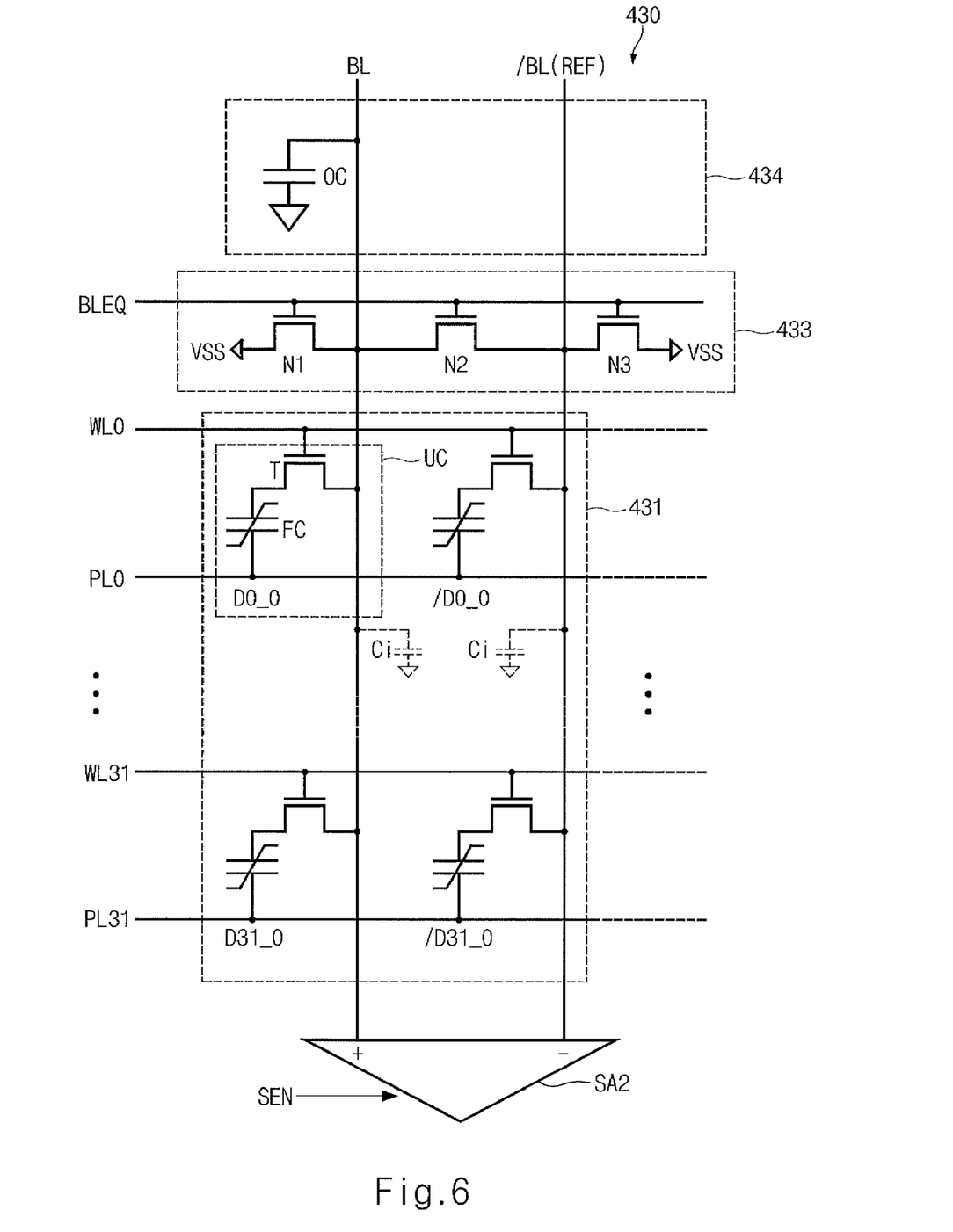
FIG. 6 is a circuit diagram showing a cell array unit of the memory of FIG. 5

FIG. 6 is a circuit diagram showing a cell array unit of the memory of FIG. 5 according to an embodiment of the present invention.

The cell array unit 430 comprises a cell array 431, a sense amplifier SA2, a bit line equalizer 433, and an offset capacitor unit 434, is the offset capacitor unit being an offset controller.

The cell array 431 includes a pair of bit lines BL and /BL, a plurality of word lines WL, a plurality of plate lines PL, and a plurality of unit cells UC are positioned at intersections of the word lines WL and the bit lines BL, /BL between a word line WL and a plate line PL.

The unit cell UC connected to the bit line BL and the unit cell UC connected to the bit line /BL store conjugate data D and /D. A voltage sensed in the cell array 431 is applied to the bit line BL, and a reference voltage REF is applied to the bit line /BL.

Each of the unit cells UC includes a ferroelectric capacitor FC and a switching element T. The ferroelectric capacitor FC is connected between the plate line PL and the switching element T. The switching element T is connected between the bit line BL (or the bit line /BL) and the ferroelectric capacitor FC. The switching element T may comprise, for example, a MOS transistor. A gate of the MOS transistor (switching element T) is connected to the word line WL.

The sense amplifier SA2 is connected between the paired bit lines BL and /BL, and activated by a sense amplifier enable signal SEN. The sense amplifier SA1 senses and amplifies a voltage difference of the paired bit lines BL and /BL when the sense amplifier SA2 is activated by the sense amplifier enable signal SEN.

The bit line equalizer 433 includes NMOS transistors N1~N3. The NMOS transistor N1 is connected between a ground voltage terminal VSS and the bit line BL, the NMOS transistor N2 is connected between the paired bit lines BL and /BL, and the NMOS transistor N3 is connected between the ground voltage terminal VSS and the bit line /BL. As shown in FIG. 6, the respective gates of the NMOS transistors N1~N3 are connected to a bit line equalizing signal BLEQ. When the bit line equalizing signal BLEQ is activated, the NMOS transistors N1~N3 are turned on to equalize the paired bit lines BL and /BL.

The offset capacitor unit 434 includes an offset capacitor OC connected between the bit line BL and the ground voltage terminal VSS. The total bit line capacitance CBL induced to the bit line BL is obtained by summing the original capacitance Ci of the bit line and the capacitance Coffset of the offset capacitor OC. That is, CBL=Ci + Coffset. The total bit line capacitance CBL induced to the bit line /BL is the original capacitance Ci of the bit line. That is, CBL=Ci.

Figure 7:
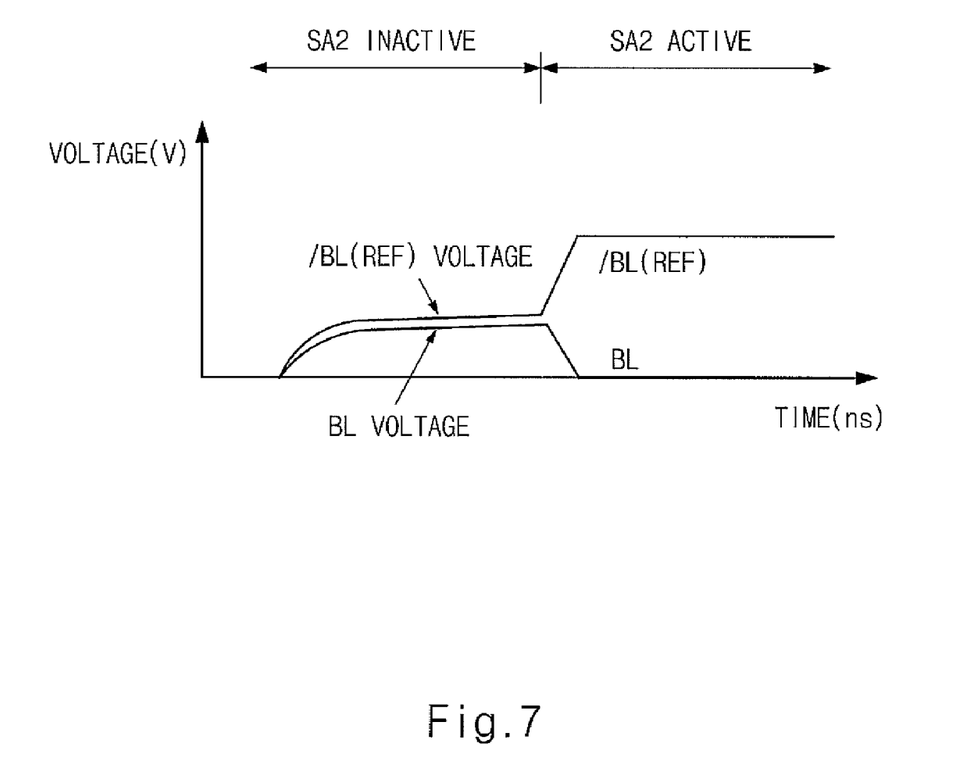
FIG. 7 is a graph showing a voltage waveform of a bit line in a cell operation of the cell array unit of FIG. 6.

FIG. 7 is a graph showing a voltage waveform of a bit line in a cell operation of the cell array unit of FIG. 6.

As mentioned above, the bit line capacitance CBL induced to the bit line BL is obtained by summing the original capacitance Ci of the bit line and the capacitance Coffset of the offset capacitor OC. The total bit line capacitance CBL induced to the bit line /BL is the original capacitance Ci of the bit line.

Since the ferroelectric capacity stored in the cell is the same, sensing voltage levels induced to each of the paired bit lines BL and /BL are the same. However, a voltage level between the bit lines BL and /BL is different due to the offset capacitor OC connected to the bit line BL.

Specifically, the total bit line capacitance CBL induced to the bit line /BL is Ci, and the total bit line capacitance CBL induced to the bit line BL is Ci+Coffset. Since the charge amount is predetermined, Q is regular in Q=CV, where Q denotes charge in coulombs, C denotes capacitance in Farads, and V denotes voltage potential in volts. As a result, as the value of C decreases, the value of V increases, accordingly.

Since the total bit line capacitance CBL induced to the bit line /BL is smaller than that induced to the bit line BL, the voltage level of the bit line /BL is higher than that of the bit line BL.

Charges are distributed into the paired bit lines BL and /BL, respectively, after the sense amplifier SA2 is activated. As a result, the voltage levels of the paired bit lines BL and /BL are differentiated, respectively, at a low level and at a high level. That is, after the sense amplifier SA2 is activated, the voltage level of the bit line BL transitions to a low level, and the voltage level of the bit line /BL transitions to a high level.

Figure 8:
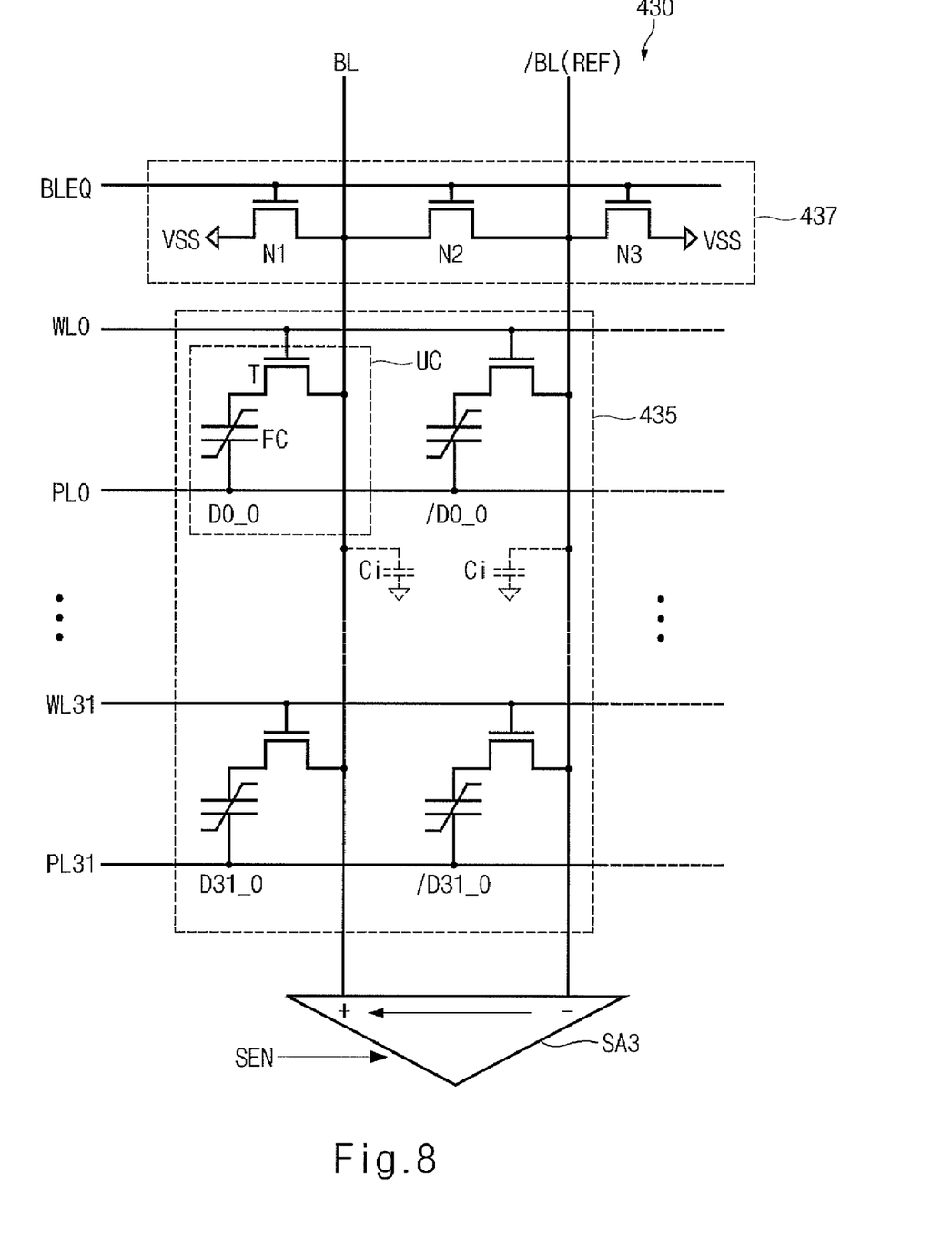
FIG. 8 is a circuit diagram showing another cell array unit of the memory of FIG. 5.

FIG. 8 is a circuit diagram showing another cell array unit of the memory of FIG. 5.

The cell array unit 430 comprises a cell array 435, a sense amplifier SA3, and a bit line equalizer 437.

The cell array 435 includes a pair of bit lines BL and /BL, a plurality of word lines WL, a plurality of plate lines PL, and a plurality of unit cells UC positioned at intersections of the word lines WL and the bit line BL, /BL between a word line WL and a plate line PL.

The unit cell UC connected to the bit line BL and the unit cell UC connected to the bit line /BL store conjugate data D and /D.

Each of the unit cells UC includes a ferroelectric capacitor FC and a switching element T. The ferroelectric capacitor FC is connected between the plate line PL and the switching element T. The switching element T is connected between the bit line BL (or the bit line /BL) and the ferroelectric capacitor FC. The switching element T may comprise, for example, a MOS transistor. A gate of the MOS transistor is connected to the word line WL.

The bit line equalizer 437 includes NMOS transistors N1~N3. The NMOS transistor N1 is connected between a ground voltage terminal VSS and the bit line BL, the NMOS transistor N2 is connected between the paired bit lines BL and /BL, and the NMOS transistor N3 is connected between the ground voltage terminal VSS and the bit line /BL. As shown in FIG. 8, the respective gates of the NMOS transistors N1~N3 are connected to a bit line equalizing signal BLEQ. When the bit line equalizing signal BLEQ is activated, the NMOS transistors N1~N3 are turned on to equalize the paired bit lines BL and /BL.

The sense amplifier SA3 is connected between the paired bit lines BL and /BL, and activated by a sense amplifier enable signal SEN. The sense amplifier SA1 senses and amplifies a voltage difference of the paired bit lines BL and /BL when the sense amplifier SA3 is activated by the sense amplifier enable signal SEN.

In the sense amplifier SA3, a positive (+) terminal thereof is connected to the bit line BL, and a negative (−) terminal thereof is connected to the bit line /BL. The sense amplifier SA3 amplifies a current sensed in the paired bit lines BL and /BL to output an offset voltage.

As shown in FIG. 8, neither of the paired bit lines BL and /BL includes a capacitor, therefore the total bit line capacitance CBL is the same for each bit line of the paired bit lines BL, /BL. also, the total bit line capacitance of each bit line of the paired bit lines BL, /BL is the original capacitance Ci of the bit line.

Although the paired bit lines BL and /BL have the same capacitance Ci, an input of the sense amplifier SA3 is set to have a specific offset voltage. That is, in the sense amplifier SA3, the current driving capacity of the positive (+) terminal connected to the bit line BL is set to be higher than that of the negative (−) terminal connected to the bit line /BL.

Figure 9:
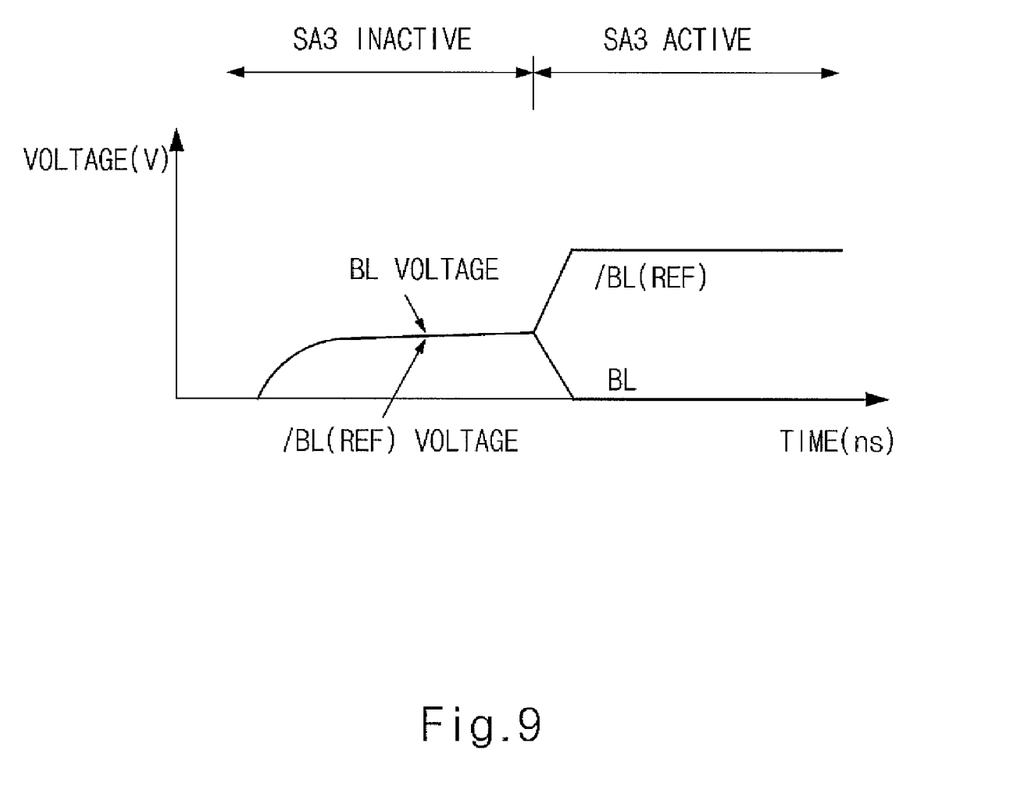
FIG. 9 is a graph showing a voltage waveform of a bit line in a cell operation of the cell array unit of FIG. 8.

FIG. 9 is a graph showing a voltage waveform of a bit line in a cell operation of the cell array unit of FIG. 8.

During the initial cell operation, the capacitance Ci of the bit lines BL and /BL is the same. Since the capacity of the ferroelectric capacitor stored in the cell is the same, the levels of the sensing voltages induced to the bit lines BL and /BL are the same.

When the bit line equalizer 437 is activated before the sense amplifier SA3 is activated, the voltage levels of the bit lines BL and /BL are the same. On the other hand, since charges are distributed into the paired bit lines BL and /BL, respectively, after the sense amplifier SA3 is activated, the voltage levels of the paired bit lines BL and /BL are differentiated at a low level and at a high level, respectively. That is, as shown in FIG. 9, the voltage level of the bit line BL transitions to a low level, and the voltage level of the bit line /BL transitions to a high level.

In the sense amplifier SA3, the current driving capacity of the positive (+) terminal, which is connected to the bit line BL, is set to be higher than that of the negative (−) terminal, which is connected to the bit line /BL. As a result, the voltage level of the bit line BL transitions to the low level, and the voltage level of the bit line /BL transitions to the high level, by the offset voltage of the sense amplifier SA3. In the initial cell operation, the voltage level of the bit line BL can be set at the low level.

Figure 10:
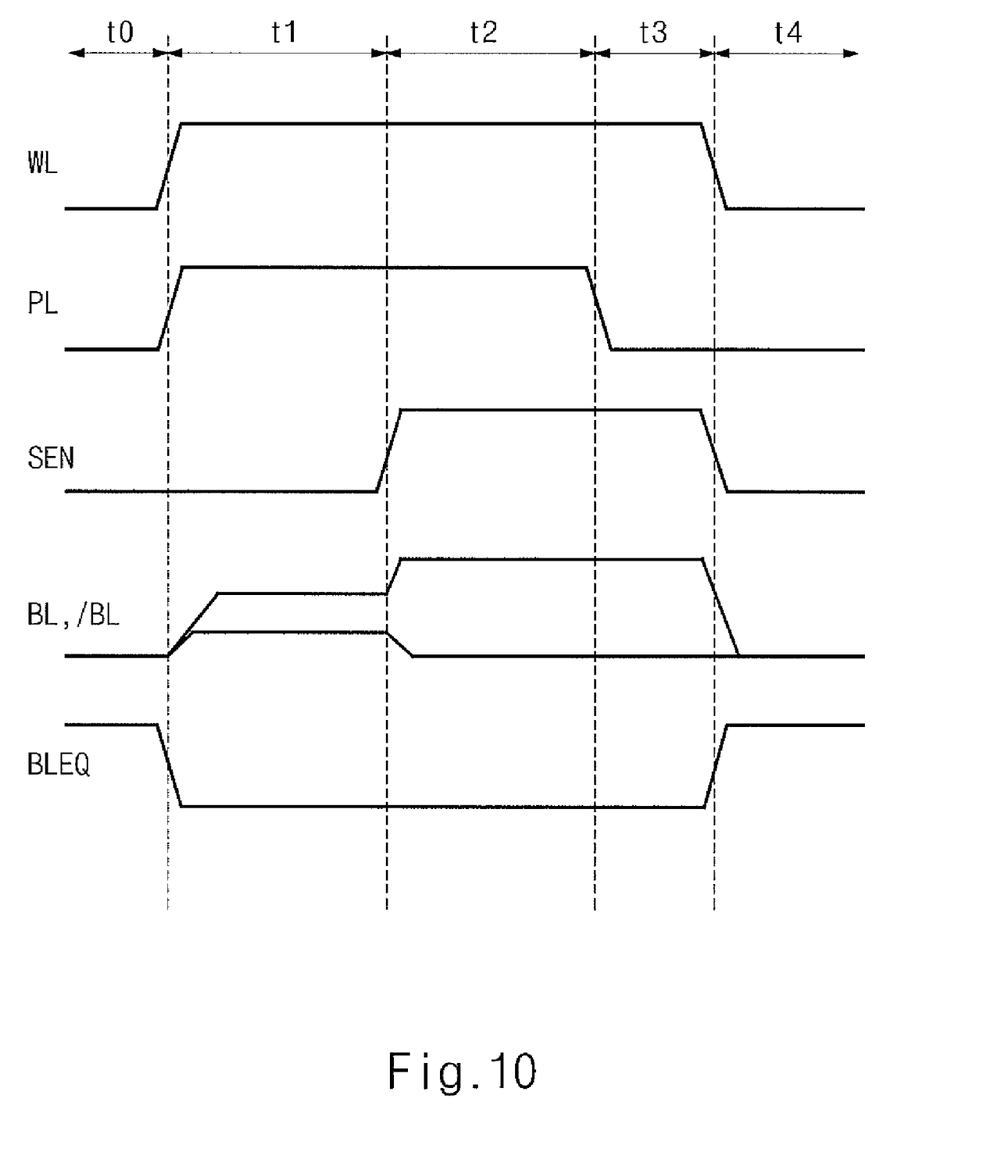
FIG. 10 is a timing diagram shown for illustrating the operation of the cell array unit of FIG. 5.

FIG. 10 is a timing diagram shown for illustrating the operation of the cell array unit of FIG. 5.

The paired bit lines BL and /BL are precharged at a ground voltage VSS level in the period t0. The word line WL is activated in periods t1, t2, t3, and the plate line PL is activated in the periods t1, t2.

The sense amplifier enable signal SEN is activated in the periods t2, t3, and the bit line equalizing signal BLEQ is activated in periods t0, t4. The paired bit lines BL and /BL are developed in the periods t2, t3 where the word line WL and the plate line PL are activated to amplify data.

That is, when the word line WL and the sense amplifier enable signal SEN are both activated, the sense amplifier SA2 (or the sense amplifier SA3) starts being driven. The paired bit lines BL and /BL share charges in the period t1, and are developed in the periods t2 and t3 to amplify data. The data "0" is restored in the period t2, and the data "1" is restored in the period t3.

Figure 11:
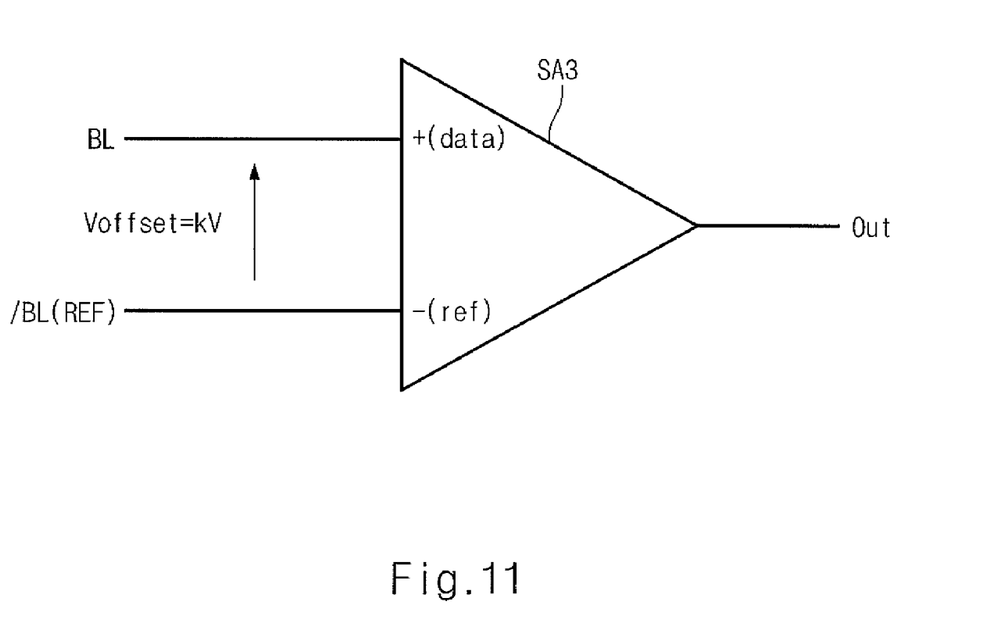
FIG. 11 is a diagram shown for illustrating an offset voltage of the sense amplifiers of FIGS. 6 and 8.

FIG. 11 is a diagram shown for illustrating an offset voltage of the sense amplifiers of FIGS. 6 and 8.

The voltage levels of the bit lines BL and /BL (REF) are the same before the sense amplifier SA3 of the cell array unit 430 is activated. However, the current driving capacity of the positive (+) terminal connected to the bit line BL is set to be higher than that of the negative (−) terminal connected to the bit line /BL in the sense amplifier SA3.

As a result, the voltage level of the bit line BL inputted to the positive (+) terminal of the sense amplifier SA3 is different from the reference voltage level of the bit line /BL inputted to the negative (−) terminal of the sense amplifier SA3.

The offset voltage Voffset between the positive (+) terminal and the negative (−) terminal of the sense amplifier SA3 is "kV." In this case, the sense amplifier outputs the data "0" when values of the bit lines BL and /BL are the same, and the data "1" when the voltage level of the bit line BL is larger than that of the offset voltage Voffset.

Figure 12:
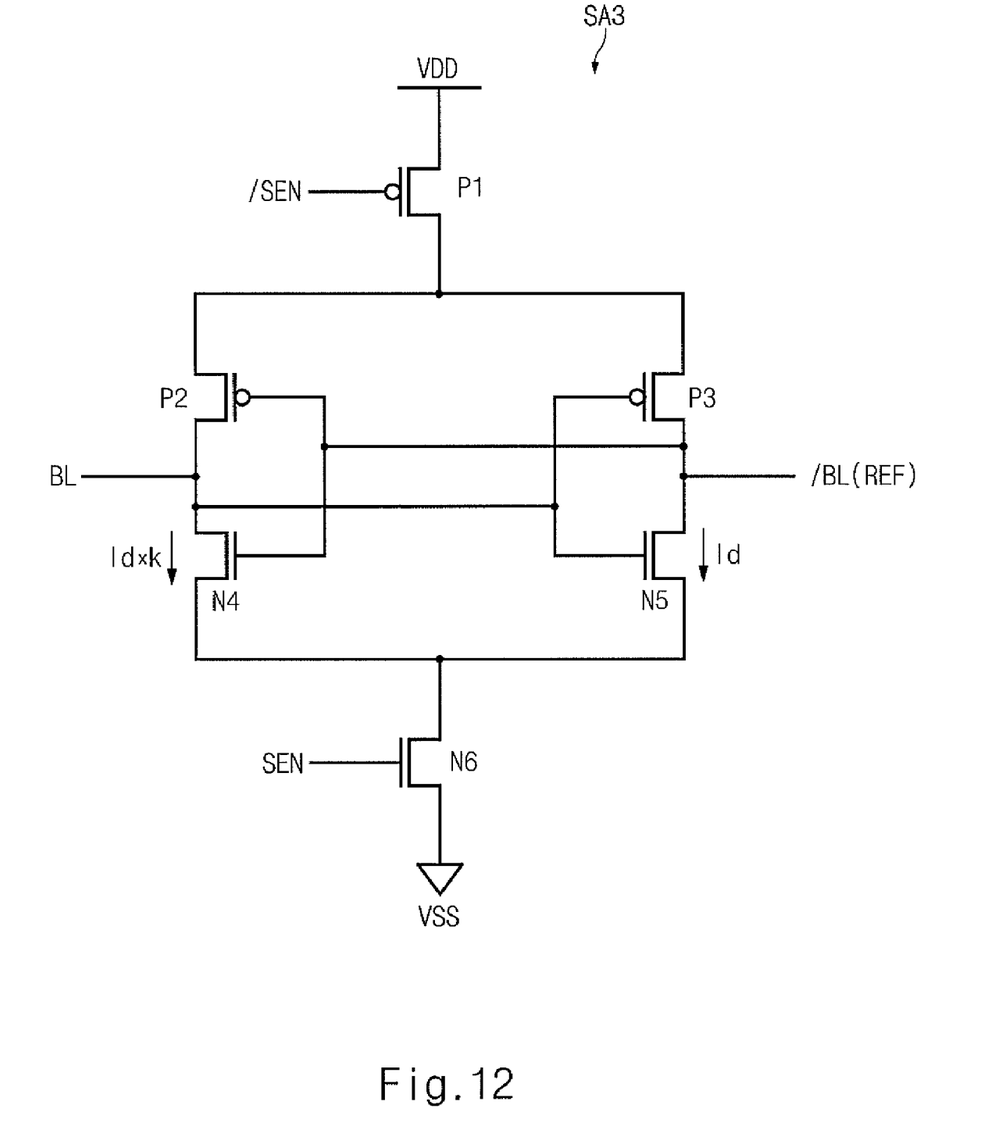
FIG. 12 is a circuit diagram showing the sense amplifier of FIG. 11.

FIG. 12 is a circuit diagram showing the sense amplifier of FIG. 11.

The sense amplifier SA3 includes PMOS transistors P1~P3 and NMOS transistors N4~N6. The PMOS transistor P1 and the NMOS transistor N6 are activation units for activating the sense amplifier SA3. The PMOS transistors P2, P3 and the NMOS transistors N4, N5 are driving units for setting the current driving capacity of the bit lines BL and /BL such that the current driving capacity of the bit line BL is different from that of the bit line /BL.

The PMOS transistor P1 is connected between a power voltage VDD applying terminal and the PMOS transistors P2, P3, and a gate of the PMOS transistor P1 is configured to receive a sense amplifier enable signal /SEN.

The PMOS transistors P2, P3, and the NMOS transistors N4, N5 are cross-coupled between the PMOS transistor P1 and the NMOS transistor N6.

A common gate of the PMOS transistor P2 and the NMOS transistor N4 is connected to the bit line /BL, and a common gate of the PMOS transistor P3 and the NMOS transistor N5 is connected to the bit line BL.

The NMOS transistor N6 is connected between the NMOS transistors N4, N5 and a ground voltage VSS applying terminal, and the gate of the NMOS transistor N6 is configured to receive the sense amplifier enable signal SEN. The sense amplifier enable signal SEN has an opposite phase to that of the sense amplifier enable signal /SEN.

In the sense amplifier SA3, the current characteristic of the NMOS transistor N4 is set to be larger by k times than that of the NMOS transistor N5 (k is a constant larger than 1). As a result, a current Id×k flows in a drain-source direction of the NMOS transistor N4, and a current Id flows in a drain-source direction of the NMOS transistor N5.

Specifically, when the sense amplifier enable signal SEN is at a high level, the sense amplifier enable signal /SEN is at a low level, and as a result, the PMOS transistor P1 and the NMOS transistor N6 are turned on thereby activating the sense amplifier SA3. In this case, the current Id×k flows in the bit line BL, and the current Id flows in the bit line /BL.

The offset voltage Voffset between the positive (+) terminal and the negative (−) terminal of the sense amplifier SA3 is "kV." In this case, the sense amplifier SA3 outputs the data "0" when values of the bit lines BL and /BL are the same, and the data "1" when the voltage level of the bit line BL is larger than that of the offset voltage Voffset.

The sense amplifier SA3 can sets a specific variable of the offset voltage Voffset using the NMOS transistors N4, N5. The setting method is shown in Table 1. In this case, k is a constant larger than 1.

TABLE 1

|  | Offset characteristic variable | NMOS transistor N4 | NMOS transistor N5 | definition |
|---|---|---|---|---|
| Method 1 | Width | kW | W | Channel Width |
| Method 2 | Length | L | kL | Channel Length |
| Method 3 | Vt | Vtn | kVtn | Threshold Voltage |
| Method 4 | Id | kId | Id | Drain-Source current |

Method 1 is characterized in that the channel widths of the NMOS transistor N4 and N5 are set to be different from each other. That is, the channel width of the NMOS transistor N4 is set to be kW, and the channel width of the NMOS transistor N5 is set to be W, accordingly, the current driving capacity of the bit line BL is set to be higher than that of the bit line /BL.

Method 2 is characterized in that the channel lengths of the NMOS transistor N4 and N5 are set to be different from each other. That is, the channel length of the NMOS transistor N4 is set to be L, and the channel length of the NMOS transistor N5 is set to be kL, accordingly, the current driving capacity of the bit line BL is set to be higher that that of the bit line /BL.

Method 3 is characterized in that the threshold voltages of the NMOS transistor N4 and N5 are set to be different from each other. That is, the threshold voltage of the NMOS transistor N4 is set to be Vtn, and the threshold voltage of the NMOS transistor N5 is set to be kVtn, accordingly the current driving capacity of the bit line BL is set to be higher than that of the bit line /BL.

Method 4 is characterized in that the drain-source currents of the NMOS transistor N4 and N5 are set to be different from each other. That is, the drain-source current of the NMOS transistor N4 is set to be kId, and the drain-source current of the NMOS transistor N5 is set to be Id, accordingly, the current driving capacity of the bit line BL is set to be higher that that of the bit line /BL.

As described above, the RFID device according to an embodiment of the present invention can set various initial data stored in a memory using an offset voltage. As a result, it is easy to design the RFID device.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements, which are within the scope of the disclosure, the drawings, and the accompanying claims. In addition to variations and modifications in the component parts and/or arrangements, alternative uses will also be apparent to those skilled in the art.

What is claimed is:

1. An RFID device comprising an analog block, a digital block, and a memory block, the memory block being configured to save data in a cell array unit,
   wherein the memory block comprises an offset controller configured to respectively set an offset voltage value of a bit line for setting the data connected to the cell array unit.

2. The RFID device according to claim 1, wherein the memory block further comprises:
   a word line decoder configured to decode an address and select a word line corresponding to the cell array unit;
   a sense amplifier configured to sense and amplify data of a selected bit line in the cell array unit;
   an input/output buffer configured to output data of the cell array unit and to transmit inputted data to the cell array unit; and
   a control signal processing unit configured to output a control signal for read/write operations to the word line decoder, the sense amplifier, and the input/output buffer.

3. The RFID device according to claim 2, wherein the cell array unit comprises:
   a cell array having a plurality of unit cells positioned at intersections of the bit line and a plurality of word lines and a plurality of plate lines; and
   a bit line equalizer configured to equalize the bit line in response to a bit line equalizing signal.

4. The RFID device according to claim 1, wherein the offset controller comprises an offset capacitor connected to a first bit line among the first bit line and a second bit line.

5. The RFID device according to claim 4, wherein the first bit line and the second bit line are connected to one sense amplifier.

6. The RFID device according to claim 4, wherein the first bit line has a capacitance equal to a sum of an original capacitance of the first bit line and a capacitance of the offset capacitor.

7. The RFID device according to claim 6, wherein the second bit line has a capacitance equal to an original capacitance of the second bit line, wherein the original capacitance of the second bit line is substantially equal to the original capacitance of the first bit line.

8. The RFID device according to claim 4, wherein the offset controller sets a voltage level of the first bit line, such that the voltage level of the first bit line is different from that of the second bit line before activation of a sense amplifier.

9. The RFID device according to claim 4, wherein the offset controller transitions a voltage level of the second bit line to a high level and transitions the voltage level of the first bit line to a low level after activation of a sense amplifier.

10. The RFID device according to claim 1, wherein the cell array unit comprises a nonvolatile ferroelectric capacitor.

11. An RFID device comprising an analog block, a digital block, and a memory block, the memory block being configured to read/write data in a cell array unit,
    wherein the memory block comprises a sense amplifier configured to sense and amplify data of a bit line selected from the cell array unit and set an offset voltage value of the bit line,
    wherein input terminals of the sense amplifier are connected to a first bit line and a second bit line, and wherein a current driving capacity of the input terminal connected to the first bit line is higher than that of the input terminal connected to the second bit line.

12. The RFID device according to claim 11, wherein the memory block further comprises:
    a word line decoder configured to decode an address and select a word line corresponding to the cell array unit;
    an input/output buffer configured to output data of the cell array unit and transmit inputted data to the cell array unit; and
    a control signal processing unit configured to output a control signal for read/write operations to the word line decoder, the sense amplifier, and the input/output buffer.

13. The RFID device according to claim 12, wherein the cell array unit comprises:
    a cell array having a plurality of unit cells positioned at intersections of the bit line and a plurality of word lines and a plurality of plate lines; and
    a bit line equalizer configured to equalize the bit line in response to a bit line equalizing signal.

14. The RFID device according to claim 11, wherein the first bit line and the second bit line are connected to one sense amplifier.

15. The RFID device according to claim 11, wherein the first bit line has a capacitance equal to an original capacitance of the first bit line and the second bit line has a capacitance equal to an original capacitance, and wherein the first original capacitance is substantially equal to the second original capacitance.

16. The RFID device according to claim 11, wherein the offset controller sets a voltage level of the first bit line, such that the voltage level of the first bit line is different from that of the second bit line before activation of the sense amplifier.

17. The RFID device according to claim 11, wherein the offset controller transitions the voltage level of the second bit line to a high level and transitions the voltage level of the first bit line to a low level after activation of the sense amplifier.

18. The RFID device according to claim 11, wherein the sense amplifier sets the first bit line to have an offset voltage value higher than that of the second bit line by kV, wherein k is a constant having a value greater than 1.

19. The RFID device according to claim 11, wherein the sense amplifier comprises:
  an activation unit configured to control activation of the sense amplifier in response to a sense amplifier enable signal; and
  a driving unit connected to the first bit line and the second bit line, and the driving unit configured to set the first bit line to have a different offset voltage value from that of the second bit line.

20. The RFID device according to claim 19, wherein the driving unit includes a pair of PMOS transistors and a pair of NMOS transistors cross-coupled between the first bit line and the second bit line.

21. The RFID device according to claim 19, wherein the driving unit comprises a plurality of transistors, the plurality of transistors having different channel widths.

22. The RFID device according to claim 19, wherein the driving unit comprises a plurality of transistors, the plurality of transistors having different channel lengths.

23. The RFID device according to claim 19, wherein the driving unit comprises a plurality of transistors, the plurality of transistors having different threshold voltages.

24. The RFID device according to claim 19, wherein the driving unit comprises transistors, the plurality of transistors having different drain-source currents.

25. The RFID device according to claim 11, wherein the cell array unit comprises a nonvolatile ferroelectric capacitor.

* * * * *